United States Patent
Jeong

(10) Patent No.: US 7,998,769 B2
(45) Date of Patent: Aug. 16, 2011

(54) FULL-COLOR ORGANIC LIGHT EMITTING DIODE DISPLAY DEVICE AND METHOD OF FABRICATING THE SAME

(75) Inventor: Hye-In Jeong, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 62 days.

(21) Appl. No.: 12/424,443

(22) Filed: Apr. 15, 2009

(65) Prior Publication Data
US 2009/0261322 A1    Oct. 22, 2009

(30) Foreign Application Priority Data
Apr. 17, 2008 (KR) .................. 10-2008-0035683

(51) Int. Cl.
*H01L 21/00* (2006.01)
*H01L 29/20* (2006.01)

(52) U.S. Cl. .............. 438/35; 257/89; 257/E51.026; 257/E33.001

(58) Field of Classification Search .......... 257/40, 257/89, E51.026, E33.001, E33.012; 313/504; 438/35, 22, 28, 82
See application file for complete search history.

(56) References Cited

U.S. PATENT DOCUMENTS

| | | | |
|---|---|---|---|
| 2003/0042848 A1* | 3/2003 | Park et al. ................. | 313/503 |
| 2004/0026663 A1* | 2/2004 | Heuer et al. ............. | 252/301.16 |
| 2005/0112402 A1* | 5/2005 | Lee et al. .................. | 428/690 |
| 2005/0112403 A1* | 5/2005 | Ju et al. ..................... | 428/690 |
| 2005/0196638 A1* | 9/2005 | Son et al. .................. | 428/690 |
| 2006/0017377 A1* | 1/2006 | Ryu ............................ | 313/504 |
| 2006/0105201 A1* | 5/2006 | Lee et al. .................. | 428/690 |
| 2006/0134459 A1* | 6/2006 | Huo et al. .................. | 428/690 |
| 2006/0258173 A1 | 11/2006 | Xiao et al. | |

(Continued)

FOREIGN PATENT DOCUMENTS

JP          10-231479          9/1998

(Continued)

OTHER PUBLICATIONS

Korean Office action dated Jun. 24, 2009, for priority Korean application 10-2008-0035683, noting listed references in this IDS.

*Primary Examiner* — Matthew C Landau
*Assistant Examiner* — Latanya Crawford
(74) *Attorney, Agent, or Firm* — Christie, Parker & Hale, LLP

(57) ABSTRACT

A full-color organic light emitting diode display device and a method of fabricating the same. The display device includes a substrate having red, green and blue light emitting regions, a first electrode on the substrate, an organic layer on the first electrode and including red, green and blue light emitting layers respectively corresponding to the red, green and blue light emitting regions, and a second electrode on the entire surface of the substrate. Here, the organic layer includes a hole injection layer and an electron transport layer, and the organic layer in the red light emitting region includes a hole suppression layer including a material in the electron transport layer. The method includes forming the hole suppression layer on the red light emitting layer in the red light emitting region. In the method, the hole suppression layer is formed of a material for forming the electron transport layer.

12 Claims, 1 Drawing Sheet

U.S. PATENT DOCUMENTS

| | | | |
|---|---|---|---|
| 2007/0026257 A1 | 2/2007 | Begley et al. | |
| 2007/0196689 A1 | 8/2007 | Ragini et al. | |
| 2008/0116790 A1* | 5/2008 | Kho et al. | 313/504 |
| 2008/0284324 A1* | 11/2008 | Chun et al. | 313/504 |

FOREIGN PATENT DOCUMENTS

| | | |
|---|---|---|
| JP | 2000-68062 | 3/2000 |
| JP | 2004-71495 | 3/2004 |
| JP | 2007-51363 | 3/2007 |
| KR | 10-2003-0020034 | 3/2003 |
| KR | 10-2004-0070171 | 8/2004 |
| KR | 10-2005-0050487 | 5/2005 |
| KR | 10-2006-0113007 | 11/2006 |
| KR | 10-2007-0020051 | 2/2007 |
| KR | 10-2007-0083045 | 8/2007 |

* cited by examiner

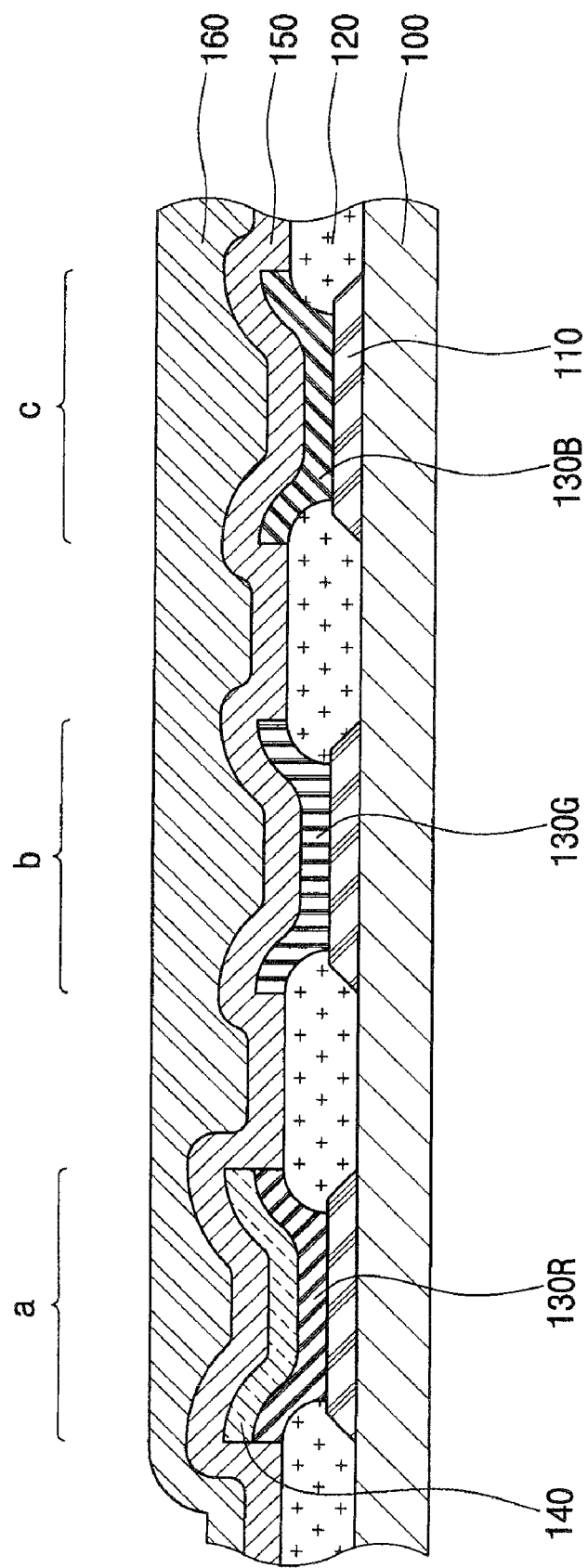

FULL-COLOR ORGANIC LIGHT EMITTING DIODE DISPLAY DEVICE AND METHOD OF FABRICATING THE SAME

CROSS-REFERENCE TO RELATED APPLICATION

This application claims priority to and the benefit of Korean Patent Application No. 10-2008-35683, filed Apr. 17, 2008, the entire content of which is incorporated herein by reference.

BACKGROUND OF THE INVENTION

1. Field of the Invention

The present invention relates to a full-color organic light emitting diode display device and a method of fabricating the same.

2. Description of the Related Art

In general, an organic light emitting diode display device is a light emitting diode display device in which electrons and holes are injected into a light emitting layer from an electron injection electrode (a cathode) and a hole injection electrode (an anode), respectively, and light is emitted when excitons produced by combining the injected electrons and holes make a transition from an excited state to a ground state.

Therefore, unlike a conventional liquid crystal display device, a separate light source is not required in the organic light emitting diode display device. As such, the organic light emitting diode display device can be made to be relatively small in volume and light in weight.

The organic light emitting diode display device may be divided into a passive matrix type and an active matrix type according to its driving method.

The passive matrix organic light emitting diode display device has a simple structure, and thus, its fabrication method is also simple. However, it has high power consumption, and it is difficult to realize a large size. Also, as the number of interconnections increases, an aperture ratio may be lowered.

Therefore, the passive matrix organic light emitting diode display device is typically utilized as a small-sized display device. On the other hand, the active matrix organic light emitting diode display device is typically utilized as a large-sized display device.

The organic light emitting diode display device may have a bottom emission structure or a top emission structure depending on a direction in which light generated from a light emitting layer is emitted. In the bottom emission structure, light is emitted toward a substrate (or a base substrate). A reflection electrode or reflection layer is formed as an upper electrode, and a transparent electrode is formed as a lower electrode. In the case that the organic light emitting diode display device employs the active matrix type in which a thin film transistor is formed, light is not transmitted through a portion at which the thin film transistor is formed, and thus, an area through which light is emitted may be reduced. By contrast, in the top emission structure, a transparent electrode is formed as the upper electrode, and a reflection electrode or reflection layer is formed as the lower electrode, so that light is emitted in a direction away from the substrate (or the base substrate). For this reason, an area through which light is transmitted may be increased, and thus, luminance may be improved.

Also, in a full-color light emitting diode display device having red, green and blue pixel regions formed on a first electrode of a substrate, an afterimage life-span in the red pixel region is relatively shorter than that in the green and blue pixel regions. Therefore, it is difficult to reproduce full colors.

SUMMARY OF THE INVENTION

Aspects of embodiments of the present invention are directed toward a full-color organic light emitting diode display device capable of producing full colors (i.e., obtaining excellent color reproductivity) by improving life-span characteristics of a red light emitting layer in a red pixel region, and a method of fabricating the same.

Another aspect of an embodiment of the present invention is directed toward a method of fabricating a full-color organic light emitting diode display device capable of improving luminance and efficiency of the display by forming a hole suppression layer containing the same (or substantially the same) material as that for an electron transport layer on a red light emitting layer in a red light emitting region.

According to an embodiment of the present invention, a full-color organic light emitting diode display device includes: a substrate including a red light emitting region, a green light emitting region, and a blue light emitting region; a first electrode on the substrate; an organic layer including a red light emitting layer, a green light emitting layer, and a blue light emitting layer respectively corresponding to the red light emitting region, the green light emitting region, and the blue light emitting region; and a second electrode, the organic layer being between the first electrode and the second electrode and further including an electron transport layer, the organic layer in the red light emitting region further including a hole suppression layer, the hole suppression layer including a material included in the electron transport layer.

According to another embodiment to the present invention, a method of fabricating a full-color organic light emitting diode display device includes: providing a substrate including a red light emitting region, a green light emitting region, and a blue light emitting region; forming a first electrode on the substrate; forming a red light emitting layer, a green light emitting layer, and a blue light emitting layer respectively corresponding to the red light emitting region, the green light emitting region, and the blue light emitting region on the first electrode; forming a hole suppression layer on the red light emitting layer in the red light emitting region; forming an electron transport layer on the substrate and covering the red light emitting layer, the green light emitting layer, and the blue light emitting layer; and forming a second electrode on the substrate and covering the electron transport layer, wherein the hole suppression layer is formed of a material for forming the electron transport layer.

BRIEF DESCRIPTION OF THE DRAWINGS

The accompanying drawings, together with the specification, illustrate exemplary embodiments of the present invention, and, together with the description, serve to explain the principles of the present invention.

FIG. 1 is a cross-sectional schematic view of a full-color organic light emitting diode display device according to an embodiment of the present invention.

DETAILED DESCRIPTION

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

FIG. 1 is a cross-sectional schematic view of a full-color organic light emitting diode display device according to an embodiment of the present invention.

In FIG. 1, a patterned first electrode 120 is formed on a glass or plastic substrate 100, and red, green and blue pixel regions a, b and c defined by an insulating layer 110 are formed on the first electrode 120. Red, green and blue light emitting layers 130R, 130G and 130B are formed on the red, green and blue pixel regions a, b and c, respectively.

In a case of a top emission structure, a metal layer that is a reflection layer is used as the first electrode 120, and, in a case of a bottom emission structure, an indium tin oxide (ITO) or indium zinc oxide (IZO) that is a transparent electrode is used as the first electrode 120. If the first electrode 120 is a cathode electrode, a second electrode 160 which will be described below becomes an anode electrode. Alternatively, if the first electrode 120 is an anode electrode, the second electrode 160 becomes a cathode electrode.

A hole injection layer and/or a hole transport layer may be interposed between the first electrode and each of the light emitting layers. The hole injection layer includes a low molecular material such as CuPc, TNATA, TCTA or TDAPB, or a polymer material such as PANI or PEDOT. The hole transport layer includes a low molecular material such as an arylamine-based low molecular material, a hydrazone-based low molecular material, a stilbene-based low molecular material and/or a starburst-based low molecular material (e.g. NPB, TPD, s-TAD or MTADATA), and/or a polymer material such as a carbazole-based polymer, an arylamine-based polymer, a pyrilene-based polymer or a pyrrole-based polymer (e.g. PVK). The hole injection layer and/or the hole transport layer may be formed by a method such as vacuum deposition or sputtering.

After forming the red, green and blue light emitting layers 130R, 130G and 130B, a hole suppression layer 140 is formed on the red light emitting layer 130R.

Here, the hole suppression layer 140 is formed of derivatives containing a gallium complex, and may be formed by co-depositing the derivatives with an organic material such as $Alq_3$, Balq, DPB or BeBq2. The gallium complex has a structure including a plurality of ring-shaped substituents, and further includes an alkyl substituent, a cycloalkyl substituent, an aryl substituent and/or a heterocyclic substituent. The organic material such as $Alq_3$, Balq, DPB or BeBq2 has electron-transporting properties. The ring-shaped substituent of the gallium complex may further include an element such as nitrogen.

The hole suppression layer 140 includes from 50 to 100 wt % derivatives containing the gallium complex, in which luminance and efficiency are improved without an increase in driving voltage in the red pixel region, and this also assists in mass production.

The hole suppression layer 140 is formed to a thickness of 100 to 300 Å, and, in one embodiment, to a thickness of 100 to 150 Å. This is because it is possible to suppress hole transportation and reduce driving voltage when the thickness of the hole suppression layer is within the range of 100 to 300 Å.

In the red pixel region, the hole suppression layer 140 functions to suppress hole transportation and improve life-span characteristics. Therefore, the red light emitting layer having an afterimage life-span shorter than the green and blue light emitting layers can now have a relatively long life-span and improve color reproductivity in the full-color organic light emitting diode display device.

A material for the red light emitting layer 130R may include a low molecular material such as $Alq_3$ or CBP, and/or a polymer material such as a PFO-based polymer or a PPV-based polymer. A material for the green light emitting layer 130G may include a low molecular material such as $Alq_3$ or BGP, and/or a polymer material such as a PFO-based polymer or a PPV-based polymer. A material for the blue light emitting layer 130B may include a low molecular material such as DPVBi, spiro-DPVBi, spiro-6P, distyryl benzene (DSB) or distyryl arylene (DSA), and/or a polymer material such as a PFO-based polymer or a PPV-based polymer. The present invention, however, is not thereby limited, and these and other suitable materials used in the art may be utilized.

An electron transport layer 150 is formed on the entire surface of the substrate 100 having the hole suppression layer 140 formed on the red light emitting layer 130R in the red pixel region and the green and blue light emitting layers 130G and 130B. An electron injection layer may further be formed on the electron transport layer 150.

Here, in one embodiment, the electron transport layer 150 is formed of a material identical (or substantially identical) to that used for the hole suppression layer 140. Since the electron transport layer 150 is made of the same material as the material for the hole suppression layer 140, it is possible to prevent (or reduce) a voltage from being increased.

The electron injection layer includes a low molecular material such as Alq3, a Ga complex or PBD, and/or an oxadiazole-based polymer. The electron injection layer is formed by a coating method such as spin coating or deep coating, a pressing method, a spinning method, a knife coating method, and/or a deposition method such as vacuum deposition or chemical vapor deposition.

Subsequently, a second electrode 160 is formed on the entire surface of the substrate 100 having the organic layer. In the case of the top emission structure, the second electrode 160 is formed as a transparent electrode. In the case of the bottom emission structure, the second electrode 160 is formed in a structure in which a transparent electrode material is stacked on a metallic material that is a reflection layer or a reflection plate.

In a red light emitting device, Table 1 shows data for luminous efficiency of a red light emitting layer in accordance with an embodiment of the present invention.

|  | Luminous efficiency (cd/A) | Luminance | Driving voltage (V) |
| --- | --- | --- | --- |
| Embodiment 1 | 6.9 | 6895 | 5.4 |
| Embodiment 2 | 7.5 | 7479 | 5.5 |
| Comparative example 1 | 6.8 | 6721 | 5.7 |

Embodiment 1

In Embodiment 1, a hole injection layer having a thickness of 1000 Å was formed of N,N'-bis(3-naphthalen-2-yl)-N,N'-bis(phenyl)benzidine (NBP) on a first electrode of a red light emitting region, and a light emitting layer having a thickness of 400 Å was formed of RD3 (Kodak Co. Ltd.) on the hole injection layer. Then, a hole suppression layer having a thickness of 150 Å was formed by co-depositing 50 wt % TYE704 (Tokyo Ink Co. Ltd.) with 50 wt % Alq$_3$, and an electron transport layer having a thickness of 250 Å was formed of TYE704 (Tokyo Ink Co. Ltd.). After that, a second electrode was formed on the electron transport layer.

Embodiment 2

A hole injection layer having a thickness of 1000 Å was formed of NBP on a first electrode of a red light emitting region, and a light emitting layer having a thickness of 400 Å was formed of RD3 (Kodak Co. Ltd.) on the hole injection layer. Then, a hole suppression layer having a thickness of 150 Å was formed of 100 wt % TYE704 (Tokyo Ink Co. Ltd.), and an electron transport layer having a thickness of 250 Å was formed of TYE704 (Tokyo Ink Co. Ltd.) on the hole suppression layer. After that, a second electrode was formed on the electron transport layer.

Comparative Example 1

A hole injection layer having a thickness of 1000 Å was formed of NBP on a first electrode of a red light emitting region, and a light emitting layer having a thickness of 400 Å was formed of RD3 (Kodak Co. Ltd.) on the hole injection layer. Then, a hole suppression layer having a thickness of 150 Å was formed of 100 wt % Alq$_3$, and an electron transport layer having a thickness of 250 Å was formed of TYE704 (Tokyo Ink Co. Ltd.) on the hole suppression layer. After that, a second electrode was formed on the electron transport layer.

Comparing the two embodiments with the comparative example as shown in Table 1, the luminous efficiency of Embodiment 1 is 6.9 cd/A, the luminous efficiency of Embodiment 2 is 7.5 cd/A, and the luminous efficiency of Comparative example 1 is 6.8 cd/A. As the hole suppression layer is formed of a material containing a large amount of a material identical to that of the electron transport layer, luminance and luminous efficiency are improved. Since the luminous efficiency of Embodiment 1 is 6.9 cd/A and the luminous efficiency of Embodiment 2 is 7.5 cd/A, the characteristics are improved as the hole suppression layer has a high content percentage of a material equal to that of the electron transport layer.

Therefore, it can be derived that luminance and efficiency are improved in Embodiment 2 in which the hole suppression layer and the electron transport layer are formed of the same material, as compared with Comparative example 1 in which the electron transport layer and the hole suppression layer are formed of different materials.

In view of the foregoing and according to an embodiment of the present invention, a full-color organic light emitting diode display device further includes a hole suppression layer made of the same material (or substantially the same material) as an electron transport layer in a red light emitting region, so that luminance and efficiency can be improved without a fluctuation of voltage.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A full-color organic light emitting diode display device, comprising:
   a substrate including a red light emitting region, a green light emitting region, and a blue light emitting region;
   a first electrode on the substrate;
   an organic layer comprising a red light emitting layer, a green light emitting layer, and a blue light emitting layer respectively corresponding to the red light emitting region, the green light emitting region, and the blue light emitting region; and
   a second electrode, the organic layer being between the first electrode and the second electrode and further comprising an electron transport layer, the organic layer in the red light emitting region further comprising a hole suppression layer, the hole suppression layer comprising a same gallium complex included in the electron transport layer.

2. The full-color organic light emitting diode display device according to claim 1, wherein the gallium complex comprises a plurality of ring-shaped substituents, and further comprises at least one of an alkyl substituent, a cycloalkyl substituent, an aryl substituent, or a heterocyclic substituent.

3. The full-color organic light emitting diode display device according to claim 1, wherein the hole suppression layer comprises the gallium complex in a range of about 50 to about 100 wt %.

4. The full-color organic light emitting diode display device according to claim 1, wherein the hole suppression layer further comprises an organic material.

5. The full-color organic light emitting diode display device according to claim 1, wherein the hole suppression layer has a thickness of about 100 to about 300 Å.

6. The full-color organic light emitting diode display device according to claim 4, wherein the organic material comprises at least one of Alq$_3$, Balq, DPB or BeBq2.

7. A method of fabricating a full-color organic light emitting diode display device, the method comprising:
   providing a substrate including a red light emitting region, a green light emitting region, and a blue light emitting region;
   forming a first electrode on the substrate;
   forming a red light emitting layer, a green light emitting layer, and a blue light emitting layer respectively corresponding to the red light emitting region, the green light emitting region, and the blue light emitting region on the first electrode;
   forming a hole suppression layer on the red light emitting layer in the red light emitting region;
   forming an electron transport layer on the substrate and covering the red light emitting layer, the green light emitting layer, and the blue light emitting layer; and
   forming a second electrode on the substrate and covering the electron transport layer,
   wherein the hole suppression layer is formed of a same gallium complex for forming the electron transport layer.

8. The method according to claim 7, wherein the hole suppression layer is formed by co-depositing the gallium complex with an organic material.

9. The method according to claim 7, wherein the hole suppression layer is formed to have the gallium complex in a range of about 50 to about 100 wt %.

10. The method according to claim 7, wherein the hole suppression layer is formed to a thickness of about 100 to about 300 Å.

11. The method according to claim 8, wherein the organic material comprises at least one of $Alq_3$, Balq, DPB or BeBq2.

12. A full-color organic light emitting diode display device, comprising:

a substrate including a red light emitting region, a green light emitting region, and a blue light emitting region;

a first electrode on the substrate;

an organic layer comprising a red light emitting layer, a green light emitting layer, and a blue light emitting layer respectively corresponding to the red light emitting region, the green light emitting region, and the blue light emitting region; and a second electrode, the organic layer being between the first electrode and the second electrode and further comprising an electron transport layer, the organic layer in the red light emitting region further comprising a hole suppression layer between the electron transport layer and the red light emitting layer, the hole suppression layer comprising a same gallium complex of the electron transport layer.

* * * * *